(12) United States Patent
Kobayashi (10) Patent No.: US 10,497,595 B2
(45) Date of Patent: Dec. 3, 2019

(54) TRANSPORT DEVICE (71) Applicant: MURATA MACHINERY, LTD., Kyoto-shi, Kyoto (JP)

(72) Inventor: Makoto Kobayashi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 246 days.

(21) Appl. No.: 15/479,516

(22) Filed: Apr. 5, 2017

(65) Prior Publication Data

US 2017/0323817 A1    Nov. 9, 2017

(30) Foreign Application Priority Data

May 9, 2016    (JP) .................................. 2016-093739

(51) Int. Cl.
| | |
|---|---|
| *H01L 21/677* | (2006.01) |
| *B66C 19/00* | (2006.01) |
| *H01L 21/67* | (2006.01) |
| *H01L 21/673* | (2006.01) |

(52) U.S. Cl.
CPC ........ *H01L 21/67733* (2013.01); *B66C 19/00* (2013.01); *H01L 21/67265* (2013.01); *H01L 21/67386* (2013.01); *H01L 21/67706* (2013.01); *H01L 21/67712* (2013.01)

(58) Field of Classification Search
CPC .......... H01L 21/00; H01L 21/67; H01L 21/68; H01L 21/683
See application file for complete search history.

(56) References Cited

U.S. PATENT DOCUMENTS

2011/0062103 A1* 3/2011 Honda ..................... B61B 3/02
212/71

FOREIGN PATENT DOCUMENTS

| JP | 2004-277066 A | 10/2004 | |
|---|---|---|---|
| JP | 2005-347576 | * 12/2005 | ............. H01L 21/68 |
| JP | 2005-347576 A | 12/2005 | |
| JP | 2015-070004 A | 4/2015 | |

* cited by examiner

*Primary Examiner* — Robert J McCarry, Jr.
(74) *Attorney, Agent, or Firm* — Keating & Bennett, LLP (57) ABSTRACT

A transport device is capable of reliably determining a presence or absence of a lid provided on a container and/or determining detachment of the lid, with a simple configuration. The transport device transports a container that includes a lid on a side surface. The transport device includes a lid fall preventive member disposed so as to face an upper end of the lid of the container located in a transport position, and a lid detector that is disposed in the lid fall preventive member and detects the presence or absence of the upper end of the lid.

5 Claims, 10 Drawing Sheets

TRANSPORT DEVICE

CROSS REFERENCE TO RELATED APPLICATIONS

This application claims the benefit of priority to Japanese Patent Application No. 2016-093739 filed on May 9, 2016. The entire contents of this application are hereby incorporated herein by reference.

BACKGROUND OF THE INVENTION

1. Field of the Invention

The present invention relates to a transport device.

2. Description of the Related Art

A transport device, such as an overhead travelling vehicle, has been used for transport of a container that has a lid detachable from its side surface, such as a FOUP (Front Opening Unified Pod) (e.g., Unexamined Japanese Patent Publication No. 2015-70004). In the transport device, in terms of preventing a stored object, such as a semiconductor wafer, in the container from being contaminated or popping out of the container, or preventing the lid from falling, it is desirable to detect the presence or absence of the lid or detect detachment of the lid. Unexamined Japanese Patent Publication No. 2015-70004 proposes a transport device in which a pressing member is disposed in front of a lid, and this pressing member is provided with an optical sensor for detecting detachment of the lid.

However, the transport device described in Unexamined Japanese Patent Publication No. 2015-70004 has the problem of being unable to detect the presence or absence of the lid on the container being transported. The overhead travelling vehicle raises a container by a lifting driver, such as a hoist, from an automatic warehouse or the like and transfers the container in a suspended state. However, the container may already have no lid at the stage of being disposed in a transport position of the overhead travelling vehicle, e.g., when the lid has been detached in the automatic warehouse, or when the lid has been detached and has fallen during raising of the container. In those cases, the optical sensor of Unexamined Japanese Patent Publication No. 2015-70004 is unable to detect such abnormality that the container has no lid. This may cause the stored object to be contaminated or to pop out during travelling of the overhead travelling vehicle.

Further, some overhead travelling vehicles lift or lower a container with the lifting driver protruded laterally by a lateral protrusion mechanism. In such an overhead travelling vehicle, in order to laterally move a suspended container, it is necessary to dispose a detection part, which detects the presence or absence of the lid of the container or detects the detachment of the lid, so as not to obstruct the movement of the container.

SUMMARY OF THE INVENTION

Preferred embodiments of the present invention provide a transport device capable of reliably determining a presence or absence of a lid provided on a container and/or reliably determining detachment of the lid, with a simple configuration.

According to a preferred embodiment of the present invention is a transport device for holding and transporting a container that includes a lid on a side surface, the transport device including a lid fall preventive member disposed so as to face an upper end of the lid of the container located in a transport position, and a lid detector that is disposed in the lid fall preventive member and detects the presence or absence of the upper end of the lid.

The lid detector may be disposed so as to face a portion laterally apart from a center of the upper end of the lid. The transport device may further include a lid approach detector that detects an approach of the upper end of the lid. The lid approach detector may be disposed so as to face a flat portion on the lid. The lid fall preventive member may be provided with a stopper that comes into contact with a portion of the container except the lid to prevent the container from approaching. The transport device may include a lifting driver that holds the container and raises or lowers the container, and the lid fall preventive member may be provided in the lifting driver.

According to a preferred embodiment of the present invention, since the lid detector disposed in the lid fall preventive member detects the presence or absence of the lid provided on the container, it is possible to reliably determine, with a simple configuration, an abnormal state where the lid is not attached to the container.

When the lid detector is disposed so as to face the portion laterally apart from the center of the upper end of the lid, false recognition is reduced in which the lid detector detects an end of a disk-shaped member stored in the container as a lid even though there is no lid. When the transport device includes the lid approach detector that detects approach of the upper end of the lid, the lid approach detector detects that the lid is detached from the container and is falling toward the lid approach detector, thus enabling easy and reliable determination of the detachment of the lid. When the lid approach detector is disposed so as to face the flat portion on the lid, the flat portion enables accurate detection of approach of the lid. When the lid fall preventive member includes the stopper that comes into contact with a portion of the container except the lid to prevent the container from approaching, it is not only possible to significantly reduce or prevent the swing of the container being transported, but also possible to prevent the lid approach detector from erroneously detecting that the lid has been detached even though the lid is not detached, when the whole container approaches the lid approach detector due to the swing of the container during the transport. The transport device further includes a lifting driver that holds the container and raises or lowers the container. When the lid fall preventive member is provided in the lifting driver, it is possible to reliably detect the presence or absence of the lid with a simple configuration even when the lifting driver is laterally movable.

The above and other elements, features, steps, characteristics and advantages of the present invention will become more apparent from the following detailed description of the preferred embodiments with reference to the attached drawings.

DETAILED DESCRIPTION OF PREFERRED EMBODIMENTS

Hereinafter, preferred embodiments of the present invention will be described with reference to the drawings. However, the present invention is not limited thereto. In the drawings, to describe the preferred embodiments, some portion is represented with its scale changed appropriately, e.g., it is illustrated while enlarged or emphasized. In each of the following drawings, a direction in the drawing is described using an X-Y-Z coordinate system. In this X-Y-Z coordinate system, a vertical direction is taken as a Z-direction, and horizontal directions are taken as an X-direction and a Y-direction. Each of the X-direction, the Y-direction, and the Z-direction is described assuming that a direction of an arrow in the drawing is a + (plus) direction, and a direction opposite to the direction of the arrow is a − (minus) direction.

First Preferred Embodiment

Figure 1:
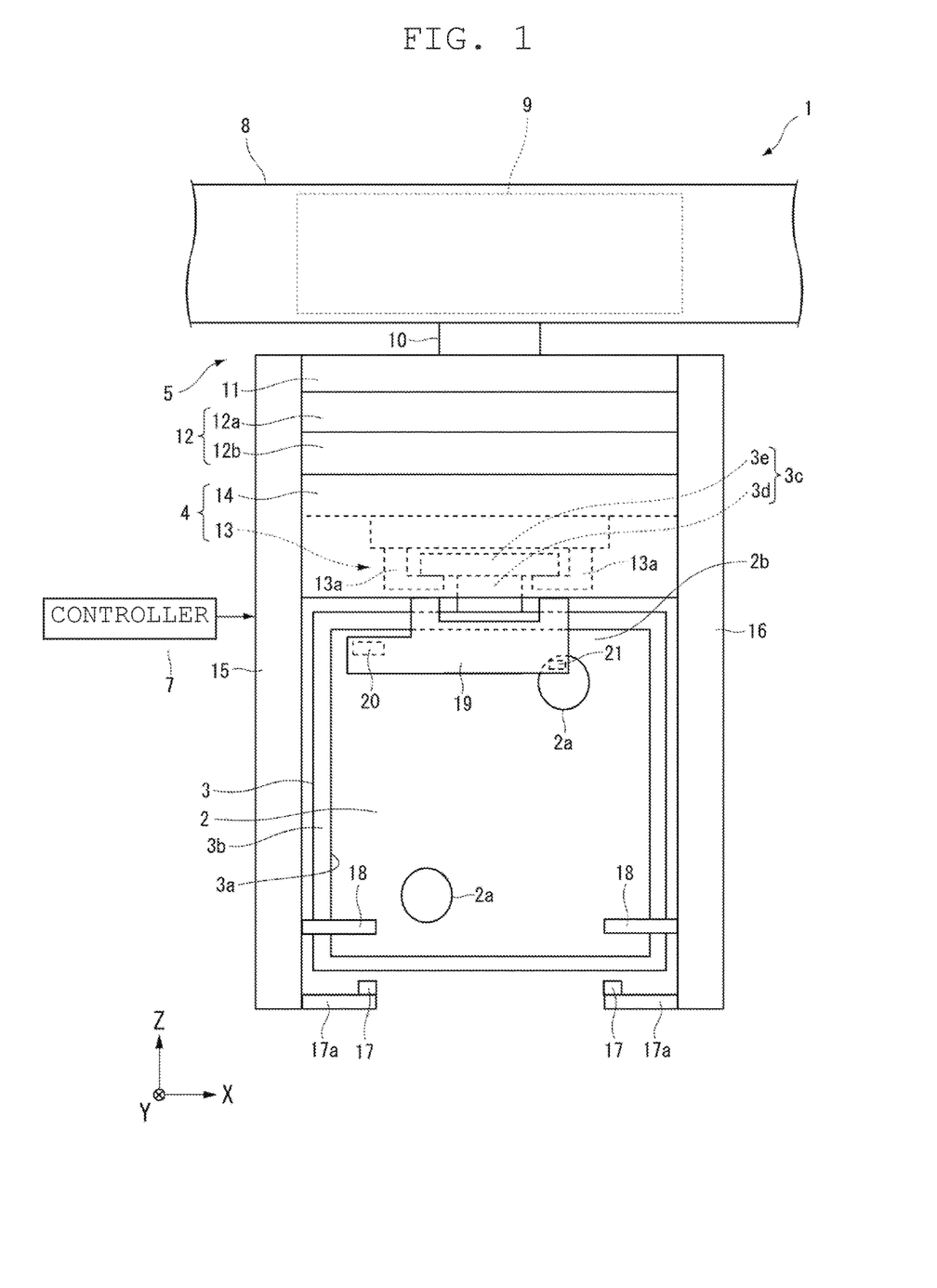
FIG. 1 is a view conceptually illustrating an example of a transport device according to a first preferred embodiment of the present invention.

FIG. 1 is a view conceptually illustrating an example of a transport device 1 according to a first preferred embodiment of the present invention. This transport device 1 preferably is used to transport a container 3 that includes a lid 2 between processing devices, automatic warehouses, or the like, for example. The container 3 is, for example, a FOUP (Front Opening Unified Pod) that stores semiconductor wafers, but it may be a container that stores objects other than semiconductor wafers.

The container 3 includes an opening 3a enabling insertion of an object to be stored, such as semiconductor wafers, into the container 3. The opening 3a is provided on a side surface 3b of the container 3. This side surface 3b is disposed parallel or substantially parallel to the vertical direction, and the opening 3a is disposed so as to be oriented in the horizontal direction (the Y-direction in FIG. 1). The lid 2 is detachably provided on the side surface 3b of the container 3 so as to cover the opening 3a. A freely selected configuration is applied to an attachment/detachment mechanism for the lid 2. An external surface (a −Y side surface) of the lid 2 is provided with a plurality of flat portions 2a to suck a sucker or the like for attachment/detachment. The flat portions 2a preferably are circular or substantially circular, for example, but the shapes of the flat portions 2a are freely selectable.

The top of the container 3 is provided with a flange 3c. The flange 3c includes a connection portion 3d on the base end side, and a rectangular plate-shaped locked portion 3e that is mounted to an upper portion of the connection portion 3d.

The transport device 1 includes a lifting driver 4 that holds the container 3 and vertically raises or lowers the container 3, an overhead travelling vehicle 5 that horizontally moves the lifting driver 4, a lid detector 20 that detects the presence or absence of the lid on the container 3, and a controller 7 configured or programmed to control each element or portion of the transport device 1.

The overhead travelling vehicle 5 includes a travelling driver 9, and travels along a travelling rail (track) 8 by a driving force of the travelling driver 9. The travelling rail 8 preferably is provided on a ceiling of a clean room, for example, and extends in the X-direction. The travelling driver 9 includes a linear motor, a travelling wheel, an encoder, and the like, which are not illustrated. The travelling wheel is disposed so as to be in contact with the travelling rail 8. The encoder detects the number of turns of the travelling wheel, and outputs the detection result to the controller 7. The controller 7 controls the linear motor based on the detection result of the encoder, and controls a speed or a stop position of the overhead travelling vehicle 5. Note that the stop position of the overhead travelling vehicle 5 may be set by identifying an index plate or the like previously installed along the travelling rail 8.

A supporting shaft 10 extending downward from the travelling driver 9 is mounted to the overhead travelling vehicle 5. A Y-direction moving element 11 is mounted to a lower portion of the supporting shaft 10. A lateral protrusion mechanism 12 is mounted to a lower portion of the Y-direction moving element 11. The lifting driver 4 is mounted to a lower portion of the lateral protrusion mechanism 12.

The Y-direction moving element 11 includes a Y-direction guide, a Y-direction driver, and the like which are not illustrated. By driving force from the Y-direction driver such as an electric motor, the Y-direction moving element 11 is able to move the lateral protrusion mechanism 12 along the guide in the +Y direction or the −Y direction. In the lateral protrusion mechanism 12, an upper plate 12a and a lower plate 12b are provided so as to overlap each other. The upper plate 12a is movable in the Y-direction with respect to the Y-direction moving element 11, and the lower plate 12b is movable in the Y-direction with respect to the upper plate 12a. The lifting driver 4 described later is mounted to the lower plate 12b. This enables the lifting driver 4 to move in the Y-direction. Operations of the Y-direction moving element 11 and the lateral protrusion mechanism 12 will be described later in FIG. 6. Note that the transport device 1 may not include the Y-direction moving element 11 or the lateral protrusion mechanism 12.

The overhead travelling vehicle 5 includes a turning assembly, not illustrated. The turning assembly includes a turning shaft, a turning driver, and the like which are not illustrated. This turning shaft is disposed parallel or substantially parallel to the Z-direction and connected to the lifting driver 4. As the turning driver, an electric motor or the like is used, and the turning shaft is turned around the Z-direction. The turning assembly can turn the turning shaft by the driving force from the turning driver, to turn the lifting driver 4 around the shaft parallel or substantially parallel to the Z-direction. The controller 7 controls and causes the turning assembly to turn the lifting driver 4 to a target position. Note that the transport device 1 may not include the turning assembly.

The lifting driver 4 includes a holder 13 that holds the container 3, and a driver 14 that vertically moves the holder 13. The holder 13 grasps the flange 3c of the container 3 to suspend and hold the container 3. The holder 13 is, for example, a chuck having a horizontally movable hook 13a. The hook 13a is inserted below the locked portion 3e and the holder 13 is raised, to hold the container 3. The holder 13 is connected with a suspension member 13b (cf. FIG. 6) such as a wire or a belt. The driver 14 is, for example, a hoist. The driver 14 feeds the suspension member 13b to lower the holder 13 and rewinds the suspension member 13b to raise the holder 13.

The controller 7 controls and causes the lifting driver 4 to lower or raise the holder 13 at a predetermined speed. Further, the controller 7 controls and causes the lifting driver 4 to hold the holder 13 at a target height. The controller 7 controls and causes the lifting driver 4 to control the height of the container 3 held in the holder 13. In the following description, a state where the container 3 held in the holder 13 has been raised to the upper end of a raising and lowering range is appropriately referred to as a suspension holding state in a transport position.

The Y-direction moving element 11, lateral protrusion mechanism 12, and lifting driver 4 described above are supported by the overhead travelling vehicle 5, and move integrally with the overhead travelling vehicle 5 in the X-direction. The side on the −X side of each of the Y-direction moving element 11, the lateral protrusion mechanism 12, and the lifting driver 4 is provided with a cover 15, and the side on the +X side thereof is provided with a cover 16. The cover 15 and the cover 16 are each supported by the overhead travelling vehicle 5 via the supporting shaft 10, and move integrally with the overhead travelling vehicle 5 in the X-direction.

In the suspension holding state for the container 3, the lower end of the cover 15 and the lower end of the cover 16 are located below the bottom surface of the container 3. The lower end of the cover 15 and the lower end of the cover 16 are each provided with a fall preventive piece 17 via a bar 17a. Lower portions of the cover 15 and the cover 16 on the −Y side are each provided with a lid pressing piece 18. The fall preventive piece 17 and the lid pressing piece 18 are also described later in FIG. 7.

Next, a lid fall preventive member 19 will be described. The lid fall preventive member 19 is provided in the −Y direction (the front surface side) of the lid 2, and prevents the lid 2 from being detached and falling from the container 3. The lid fall preventive member 19 is, for example, provided on a lower portion of the lifting driver 4, and moves together with the movement of the lifting driver 4. The lid fall preventive member 19 is disposed so as to face an upper end 2b of the lid 2 of the container 3 located in the transport position. The transport position is, for example, a position where the container 3 has been raised the most within a movable range for the container 3 by the lifting driver 4. The lid fall preventive member 19 is disposed in a position facing the upper end 2b of the lid 2 in a state where the container 3 has been raised the most within the movable range (the transport position). In this case, even with a small amount of downward positional displacement of the lid 2, it is possible to easily detect the positional displacement of the lid 2.

Figure 5A:
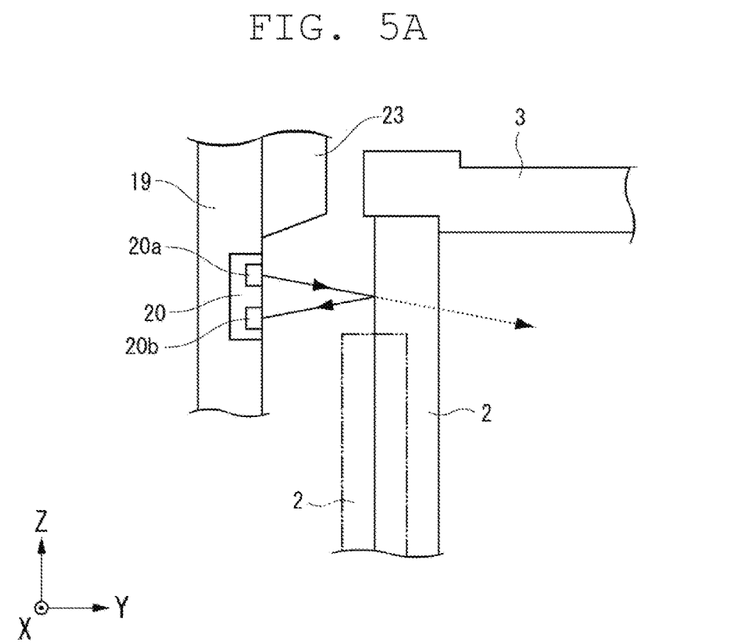
FIG. 5A is a view illustrating a positional relation between the lid detector and the lid.
Figure 5B:
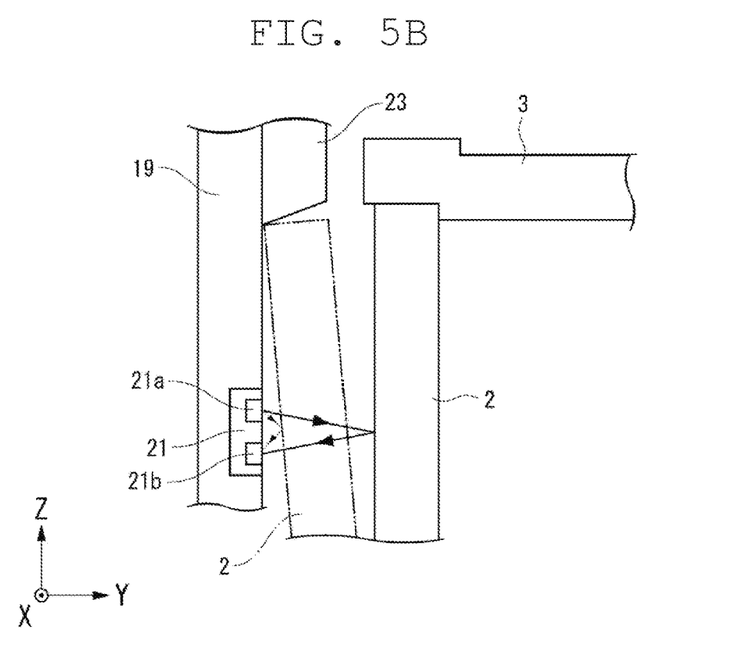
FIG. 5B is a view illustrating a positional relation between the lid approach detector and the lid.

The lid fall preventive member 19 includes the lid detector 20 and a lid approach detector 21. The lid detector 20 detects the presence or absence of the upper end 2b of the lid 2. The lid detector 20 detects whether or not the lid 2 is detached from the container 3. The lid approach detector 21 detects an approach of the upper end 2b of the lid 2. The lid approach detector 21 detects, for example, that the lid 2 is detached from the container 3 and falling toward the lid approach detector 21. The lid approach detector 21 is disposed so as to face the flat portion 2a included in the lid 2. In this case, it is easy to optically detect the flat portion 2a, for example (described later in FIG. 5), thus enabling accurate detection of approach of the lid 2. Note that the transport device 1 may not include the lid approach detector 21.

Figure 2:
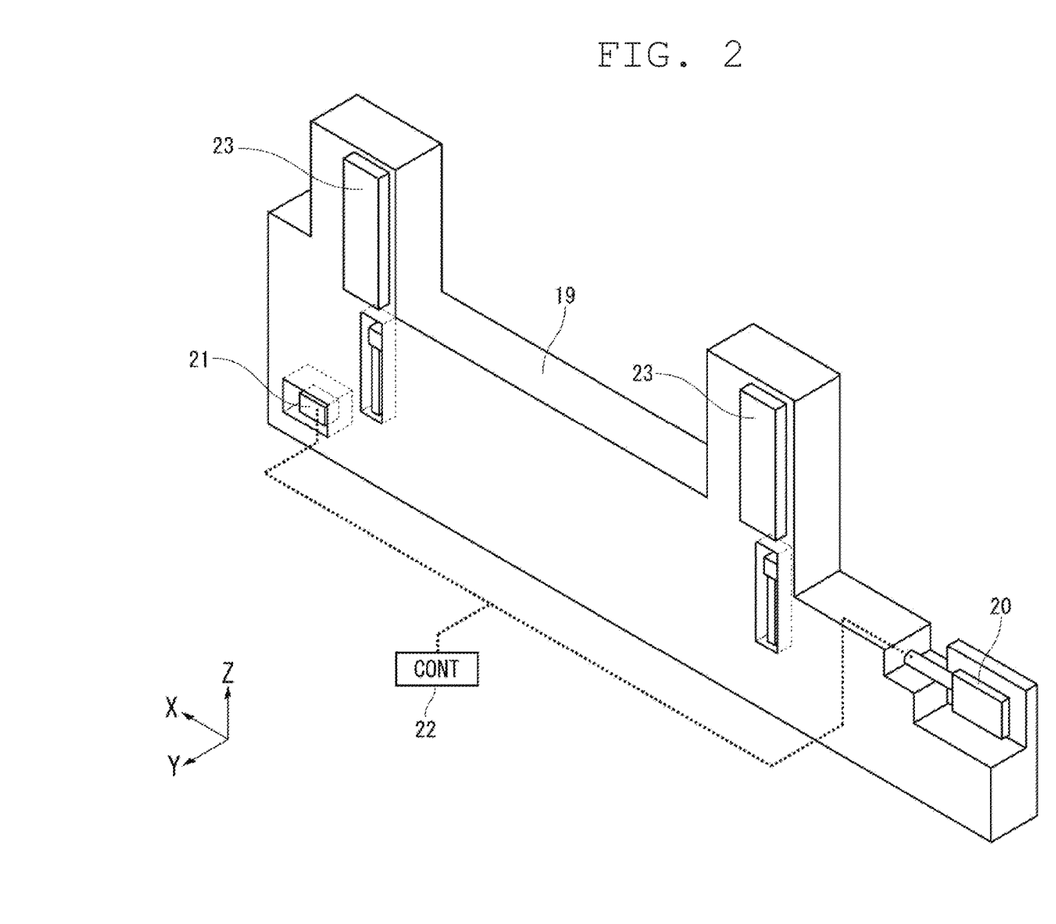
FIG. 2 is a perspective view of a lid fall preventive member as seen from a lid side of a container.
Figure 3:
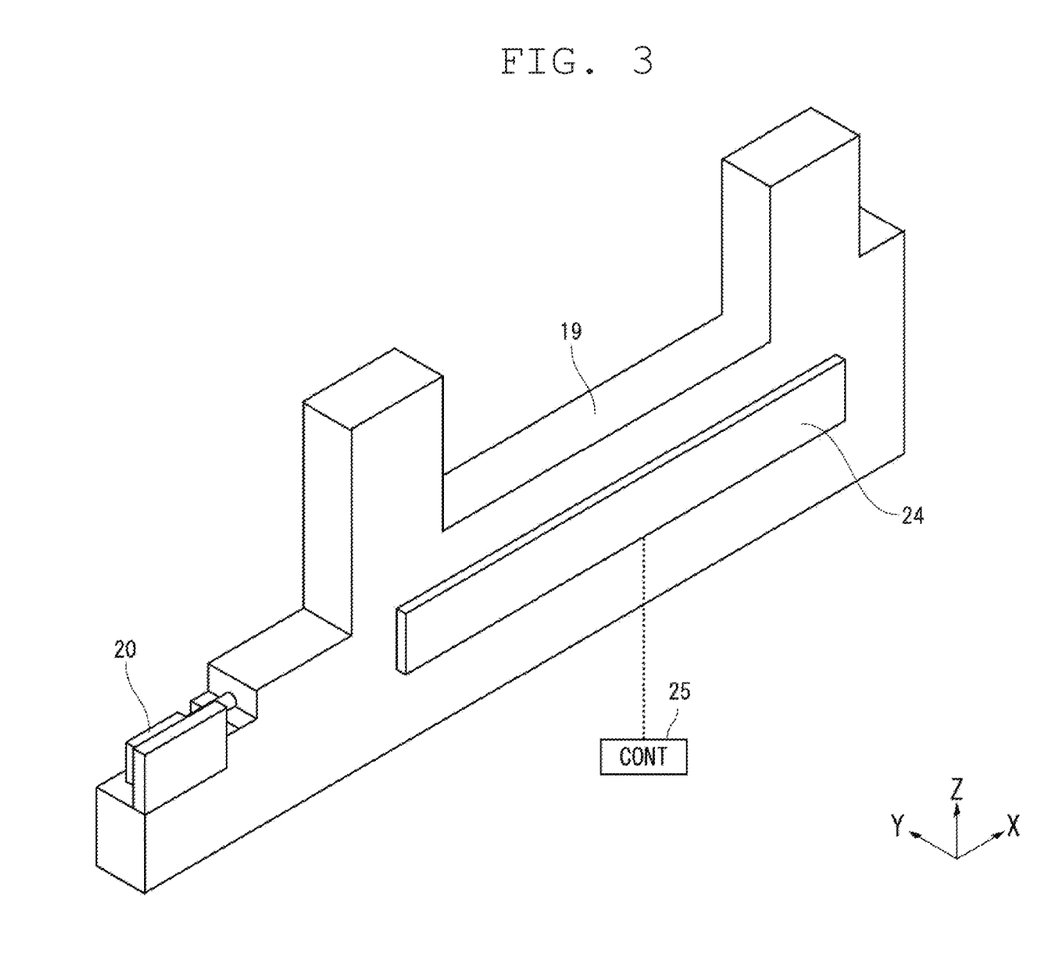
FIG. 3 is a perspective view of the lid fall preventive member as seen from outside.

FIG. 2 is a perspective view of the lid fall preventive member 19 as seen from the lid side (the +Y direction) of the container 3. FIG. 3 is a perspective view of the lid fall preventive member 19 as seen from the outside (the −Y direction). As illustrated in FIG. 2, the lid detector 20 and the lid approach detector 21 are each disposed on the container 3 side in the lid fall preventive member 19. The lid detector 20 and the lid approach detector 21 are each disposed, for example, in a recess that is depressed with respect to the lid 2. In this case, even when the lid 2 is detached and collides with the lid fall preventive member 19, a portion projecting more than the lid detector 20 or the lid approach detector 21 comes into contact with the lid 2 to support the lid 2, thus preventing collision of the lid 2 with the lid detector 20 or the lid approach detector 21.

The lid detector 20 and the lid approach detector 21 are each electrically connected with a controller 22, for example. The controller 22 performs, for example, control of operations of the lid detector 20 and the lid approach detector 21, processing on detection results of the lid detector 20 and the lid approach detector 21, control of each element or portion based on the detection results of the lid detector 20 and the lid approach detector 21, and the like. The operations of the lid detector 20, the lid approach detector 21, and the controller 22 will be described later in FIG. 5. Note that a controller configured or programmed to control the lid detector 20 and a controller configured or programmed to control the lid approach detector 21 may be provided individually.

Figure 4:
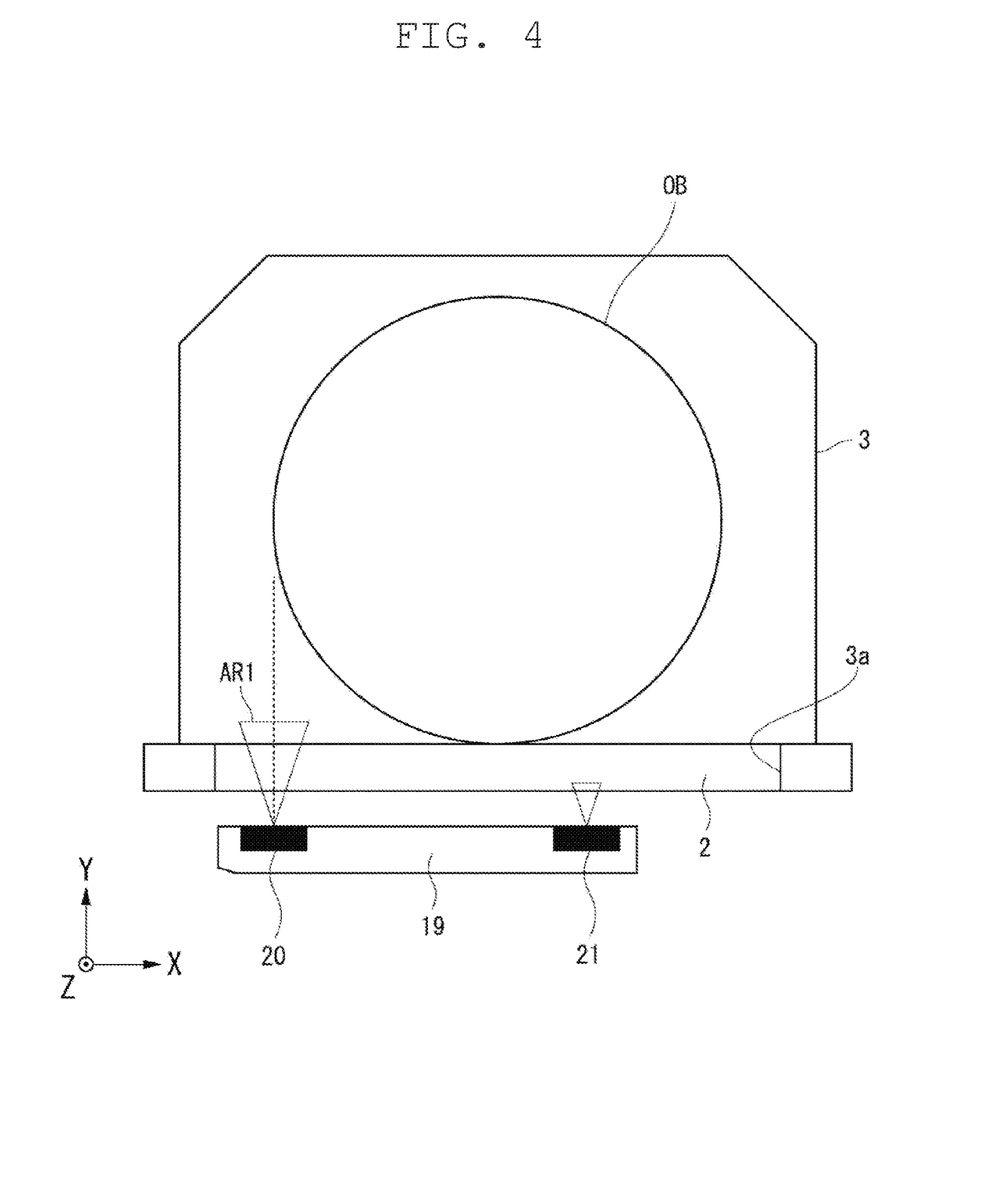
FIG. 4 is a view illustrating a positional relation among the container, a lid detector, and a lid approach detector.

FIG. 4 is a view illustrating a positional relation among the container 3, the lid detector 20, and the lid approach detector 21. The lid detector 20 is, for example, disposed so as to face a portion that is laterally (in the X-direction) apart from the center of the upper end 2b of the lid 2. For example, the lid detector 20 is disposed so as to face a portion that is apart in the −X direction with respect to the center of the upper end 2b of the lid 2. Reference symbol OB in FIG. 4 denotes a stored object which is stored in the container 3. The stored object OB has a disk shape or a cylindrical shape, for example. The surface of the stored object OB has a convex shape being increasingly spaced apart from the lid 2, from the center of the upper end 2b of the lid 2 toward the side thereof. The lid detector 20 is disposed in a position facing a portion laterally apart from the center of the upper end 2b such that a detection range AR1 of the lid detector 20 does not overlap the stored object OB. When the portion laterally apart from the center of the upper end 2b of the lid 2 faces the lid detector 20, it is possible to avoid a case where the lid detector 20 detects the stored object OB while the lid 2 is detached, thus accurately detecting the presence or absence of the lid 2.

Returning to the description of FIG. 2, the lid fall preventive member 19 includes a stopper 23. The stopper 23 is disposed, for example, on each of the −X side and the +X side of the surface on the container 3 side (the +Y side) of the lid fall preventive member 19. The stopper 23 protrudes on the container 3 side (the +Y side). When the container 3 approaches the lid fall preventive member 19 due to the swing thereof or the like, the stopper 23 comes into contact with the container 3 to prevent the container 3 from further approaching. When the container 3 moves due to the swing thereof or the like, the stopper 23 prevents a distance between the lid approach detector 21 and the lid 2 from becoming equal to or smaller than a threshold. This threshold is, for example, set in accordance with a detection range of the lid approach detector 21, and set such that the detection result of the lid approach detector 21 does not reach a level indicating approach of the lid 2 when the container 3 and the stopper 23 come into contact with each other. The function of the stopper 23 is also described later in FIG. 9. Note that the number of stoppers 23, and the shape and position of the stopper 23 are respectively not limited to those described above, and may be changed in a freely selectable manner. For example, the lid fall preventive member 19 may be provided with three or more stoppers 23. Further, whether or not the lid fall preventive member 19 includes the stopper 23 is freely selectable. The stopper 23 may be provided in a portion other than the lid fall preventive member 19, or the transport device 1 may not include the stopper 23.

As illustrated in FIG. 3, the lid fall preventive member 19 includes a contact detector 24. The contact detector 24 is disposed on the surface, which is on the opposite side to the container 3 (in the −Y direction), of the lid fall preventive member 19. The contact detector 24 is, for example, a pressure sensor such as a tape switch, and detects that the lid fall preventive member 19 has come into contact with another object. The contact detector 24 is electrically connected with a controller 25. As the detection result, the contact detector 24 outputs, to the controller 25, a signal at a level corresponding to the received pressure, for example. The controller 25 determines whether or not the contact detector 24 (the lid fall preventive member 19) has come into contact with another object based on the detection result (the signal level) of the contact detector 24. For example, when determining that the contact detector 24 has come into contact with another member due to lateral (−Y direction) movement of the lid fall preventive member 19, or the like, the controller 25 notifies (e.g., warns) an operator or the like that the lid fall preventive member 19 is in contact with another object, by voice, a display, or the like, for example. The controller 25 may control the drive of the lateral protrusion mechanism 12 based on the detection result of the contact detector 24, for example. Upon receipt of the determination result that the lid fall preventive member 19 is in contact with another object, the controller 25 may instruct the controller 7 to stop the transport of the container 3, or may decrease a transport speed of the container 3.

Next, a configuration and operation of the lid detector 20 will be described. FIG. 5A is a view illustrating a positional relation between the lid detector 20 and the lid 2. The lid detector 20 includes a light emitter 20a and an optical sensor (light receiver) 20b. The light emitter 20a is, for example, a solid light source such as a light-emitting diode (LED) or a laser diode (LD), and emits light in a direction in which the lid 2 is disposed (the +Y direction). The optical sensor 20b is, for example, a photo diode, and detects light. The light emitter 20a and the optical sensor 20b are each disposed such that, with the lid 2 disposed in a predetermined position, the light from the light emitter 20a is reflected on the lid 2 and incident on the optical sensor 20b. For example, in a normal state where the lid 2 (indicated by a solid line) is normally attached to the container 3, the light emitted by the light emitter 20a is reflected on the lid 2 and incident on the optical sensor 20b. In an abnormal state where the lid 2 (indicated by a two-dot chain line) is detached from the container 3, the light emitted by the light emitter 20a is not incident on the lid 2, or the light is reflected on the lid 2 but its direction after the reflection changes from that in FIG. 5A, and hence the light is not incident on the optical sensor 20b.

The controller 22 controls and causes the light emitter 20a to emit light from the light emitter 20a. The controller 22 controls and causes the light emitter 20a to emit light continuously or intermittently (in a pulse form) in the suspension holding state of the container 3. The controller 22 controls and causes the optical sensor 20b to perform the light detecting operation at the timing of emission of the light from the light emitter 20a. The controller 22 acquires the detection result from the optical sensor 20b, and based on this detection result, the controller 22 determines whether or not the lid 2 is detached from the container 3 (whether or not the lid 2 is normally attached to the container 3). When a level of a detection signal from the optical sensor 20b is equal to or higher than a threshold while the light is being emitted from the light emitter 20a, the controller 22 determines that the lid 2 is normally attached to the container 3. When the light is not detected by the optical sensor 20b (e.g., when the level of the detection signal is lower than the threshold) while the light is being emitted from the light emitter 20a, the controller 22 determines that the lid 2 has been detached from the container 3.

When determining that the lid 2 is detached from the container 3, the controller 22 outputs the determination result to the controller (not illustrated) of the transport device 1, for example. Upon receipt of the determination result that the lid 2 is detached from the container 3, the controller notifies (e.g., warns) the operator or the like that the lid 2 is detached from the container 3, by voice, a display, or the like, for example. Further, upon receipt of the determination result that the lid 2 is detached from the container 3, the controller may stop the transport of the container 3, or decrease the transport speed of the container 3. Note that the controller may determine, in place of the controller 25, whether or not the lid 2 is attached to the container 3 based on the detection result of the optical sensor 20b.

Next, a configuration and operation of the lid approach detector 21 will be described. FIG. 5B is a view illustrating a positional relation between the lid approach detector 21 and the lid 2. The lid approach detector 21 includes a light emitter 21a and an optical sensor (light receiver) 21b. For example, the light emitter 21a and the optical sensor (light receiver) 21b respectively have similar configurations to those of the light emitter 20a and the optical sensor 20b in the lid detector 20. The light emitter 21a emits light in the direction in which the lid 2 is disposed (the +Y direction). The optical sensor 21b detects the light. The light emitter 21a and the optical sensor 21b are each disposed such that, with the lid 2 disposed in a predetermined position, the light from the light emitter 21a is reflected on the lid 2 and incident on the optical sensor 21b. For example, in the normal state where the lid 2 (indicated by a solid line) is normally attached to the container 3, the light emitted by the light emitter 21a is reflected on the lid 2 and incident on the optical sensor 21b. In the abnormal state where the lid 2 (indicated by a two-dot chain line) is detached from the container 3 and approaching the lid fall preventive member 19, the intensity of light detected by the optical sensor 21b changes from the normal state. For example, when an LED or the like is used as the light emitter 21a, the light from the light emitter 21a is diffused light, and the intensity of light detected by the optical sensor 21b becomes high in the abnormal state, due to the approach of the lid 2 more than in the normal state. Alternatively, when a laser diode or the like is used as the light emitter 21*a*, light from the light emitter 21*a* is laser light having strong linearity, and the intensity of light detected by the optical sensor 21*b* becomes low in the abnormal state, due to the direction of the light after reflection on the lid 2 changing from the normal state light.

The light emitter 21*a* and the optical sensor 21*b* are controlled by the controller 22 in the same manner as the light emitter 20*a* and the optical sensor 20*b*. The controller 22 acquires the detection result from the optical sensor 21*b*, and based on this detection result, the controller 22 determines whether or not the lid 2 is detached from the container 3. For example, as the detection result, the optical sensor 21*b* outputs, to the controller 25, a detection signal at a level corresponding to the intensity of received light. In the state where the light emitter 21*a* is emitting light, the controller 25 compares the level of the detection signal of the optical sensor 21*b* with the threshold, to determine whether or not the lid 2 is detached from the container 3.

Figure 6:
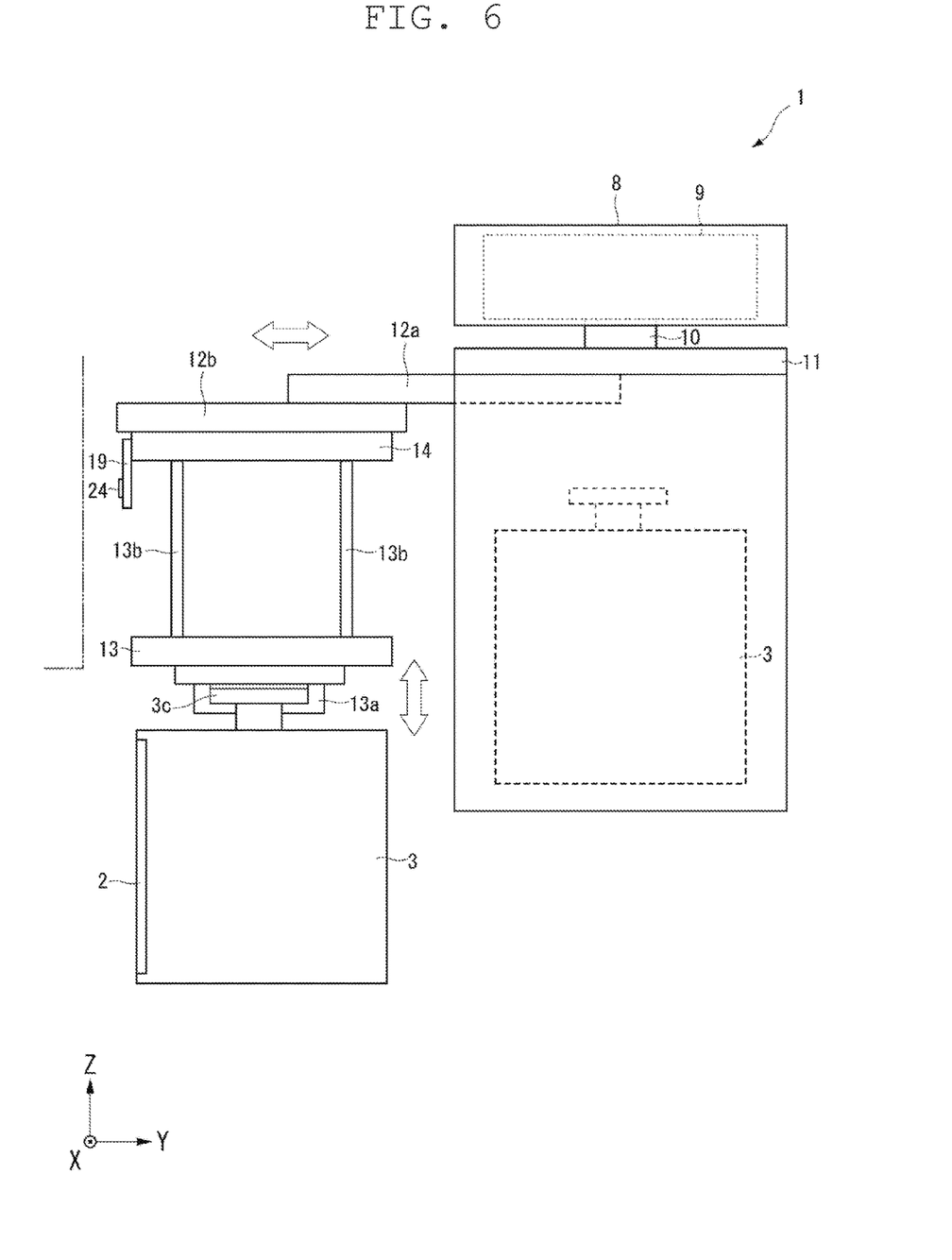
FIG. 6 is a view illustrating an example of a state where a lifting driver has been protruded laterally.

Next, lateral movement (which is referred to as lateral protrusion in the present specification) of the lifting driver 4 will be described. FIG. 6 is a view illustrating an example of a state where the lifting driver 4 has been protruded laterally. The lifting driver 4 is movable in the lateral direction (the Y-direction) where the covers 15, 16 (cf. FIG. 1) are not provided to a space that stores the container 3. When the lifting driver 4 is moved in the −Y direction, by driving force from the Y-direction driver (not illustrated) such as the electric motor, the Y-direction moving element 11 drives the upper plate 12*a* of the lateral protrusion mechanism 12 in the −Y direction with respect to the Y-direction moving element 11. Further, the Y-direction moving element 11 drives the lower plate 12*b* in the −Y direction with respect to the upper plate 12*a*, to move the lower plate 12*b* to a target position. The lifting driver 4 is provided on the lower surface side of the lower plate 12*b*. The lifting driver 4 feeds the suspension member 13*b* downward to lower the holder 13 and place the container 3 in a target position. As described above, when the transport device 1 is capable of laterally protruding the lifting driver 4, for example, the container 3 can be temporarily held on an STB (side track buffer) when another object is disposed in the target position, to enable effective operation of the transport device 1. Further, when the lid fall preventive member 19 is provided in the lifting driver 4, for example, even during lateral movement of the lifting driver 4, it is possible to reliably detect the presence or absence of the lid 2 with a simple configuration.

Figure 7:
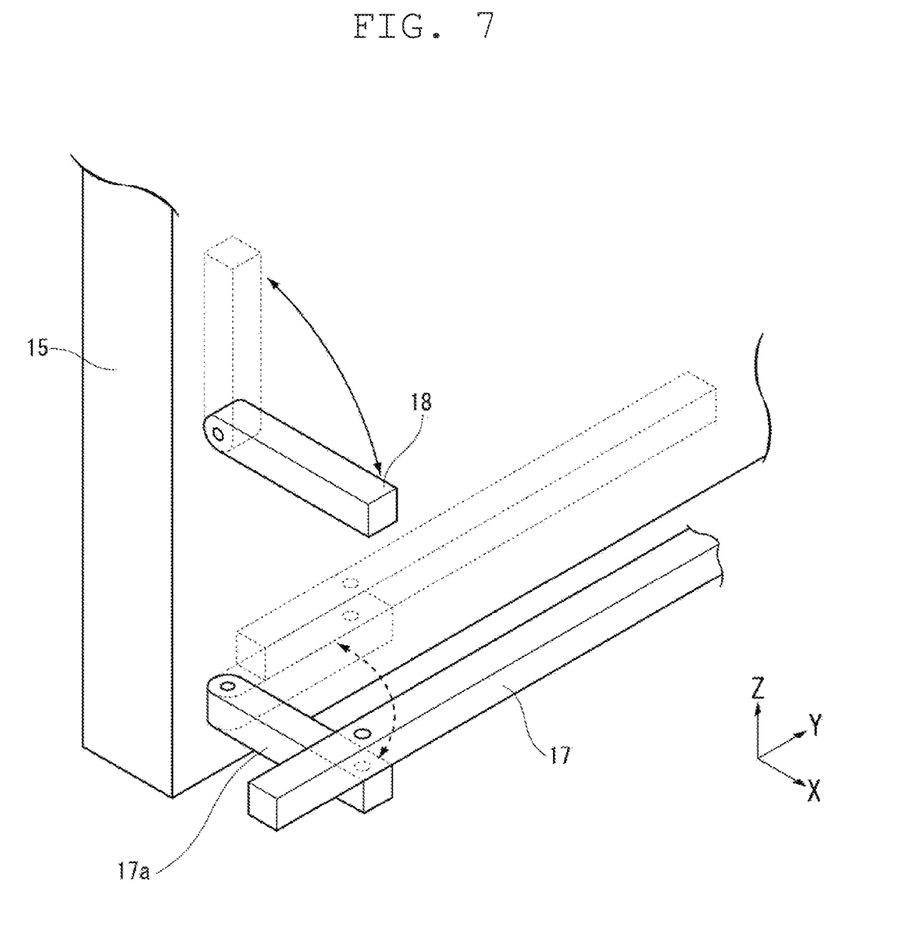
FIG. 7 is a perspective view illustrating an example of a configuration of a lower portion of the transport device.

Next, a configuration of a lower portion of the transport device 1 will be described. FIG. 7 is a perspective view illustrating an example of the configuration of the lower portion of the transport device 1. In the lower portion of the transport device 1, the bar 17*a*, the fall preventive piece 17, and the lid pressing piece 18 are disposed. The fall preventive piece 17 prevents falling of the lid 2 that has detached from the container 3. The fall preventive piece 17 is provided projecting on the front surface side (the −Y side) of the container 3 below the container 3 (cf. FIG. 8A), to support the lid 2 that has detached from the container 3. The fall preventive piece 17 is retractable with respect to a range in which the container 3 passes when the container 3 is raised or lowered. For example, the bar 17*a* can turn with respect to the cover 15 around a turning shaft parallel or substantially parallel to the Z-direction, and the fall preventive piece 17 can turn with respect to the bar 17*a* around a turning shaft parallel or substantially parallel to the Z-direction. At the time of suspending the container 3 from below, or at the time of lowering the container 3 in the suspension holding state, the fall preventive piece 17 retracts out of the range in which the container 3 passes. At this time, the bar 17*a* turns such that its longitudinal direction is parallel or substantially parallel to the Y-direction, and the fall preventive piece 17 turns such that its longitudinal direction is parallel or substantially parallel to the Y-direction. Further, when the container 3 is in the suspension holding state, the bar 17*a* and the fall preventive piece 17 turn from the retracted positions (indicated by dotted lines) to be disposed in positions indicated by solid lines. The fall preventive piece 17 and the bar 17*a* turn by being driven by a driver (not illustrated). This driver is controlled by the controller 7 (cf. FIG. 1) and turns the fall preventive piece 17 and the bar 17*a*. Whether or not to provide the fall preventive piece 17 is freely selectable, and the transport device 1 may not include the fall preventive piece 17.

The lid pressing piece 18 prevents falling of the lid 2 that has detached from the container 3. For example, in the suspension holding state, the lid pressing piece 18 regulates the movement of the lid 2 that has detached from the container 3 in the −Y direction. The lid pressing piece 18 is retractable with respect to a range (path) in which the container 3 passes at the time of lateral protrusion. For example, the lid pressing piece 18 is able to turn with respect to the cover 15 around a rotational shaft parallel or substantially parallel to the Y-direction. For example, at the time of moving the container 3 in the Y-direction by lateral protrusion or the like, the lid pressing piece 18 turns in a direction toward the cover 15 to retract out of the range in which the container 3 passes, such that a longitudinal direction of the lid pressing piece 18 becomes parallel or substantially parallel (illustrated by a dotted line) to the Z-direction. When the container 3 is in the suspension holding state, the lid pressing piece 18 turns from the retracted position (indicated by the dotted line) to be disposed in a position indicated by a solid line. Note that the lid pressing piece 18 turns by being driven by the driver (not illustrated). This driver is controlled by the controller 7 (cf. FIG. 1) and turns the lid pressing piece 18. Whether or not to provide the lid pressing piece 18 is freely selectable, and the transport device 1 may not include the lid pressing piece 18.

Figure 8A:
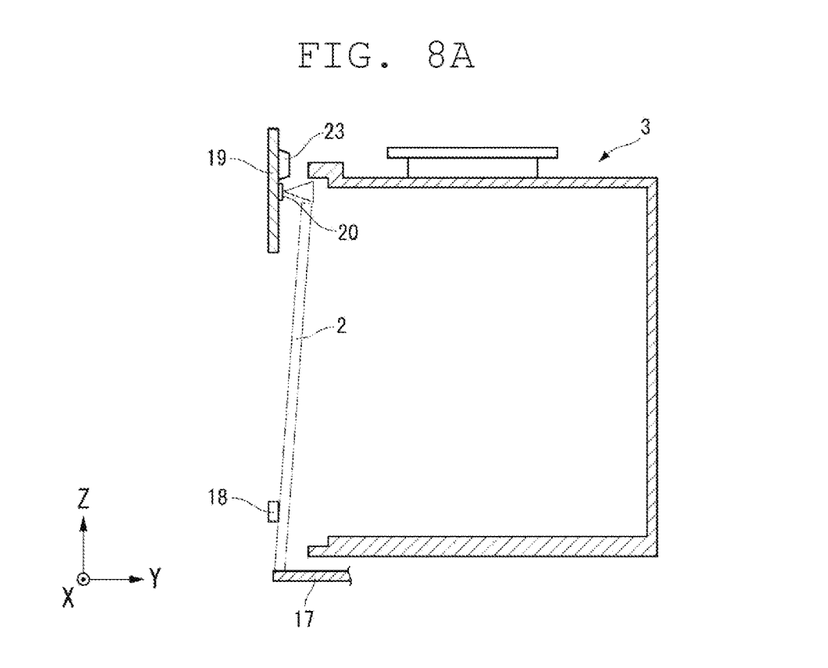
FIG. 8A is a view illustrating an example where the lid detector detects the presence or absence of the lid.
Figure 8B:
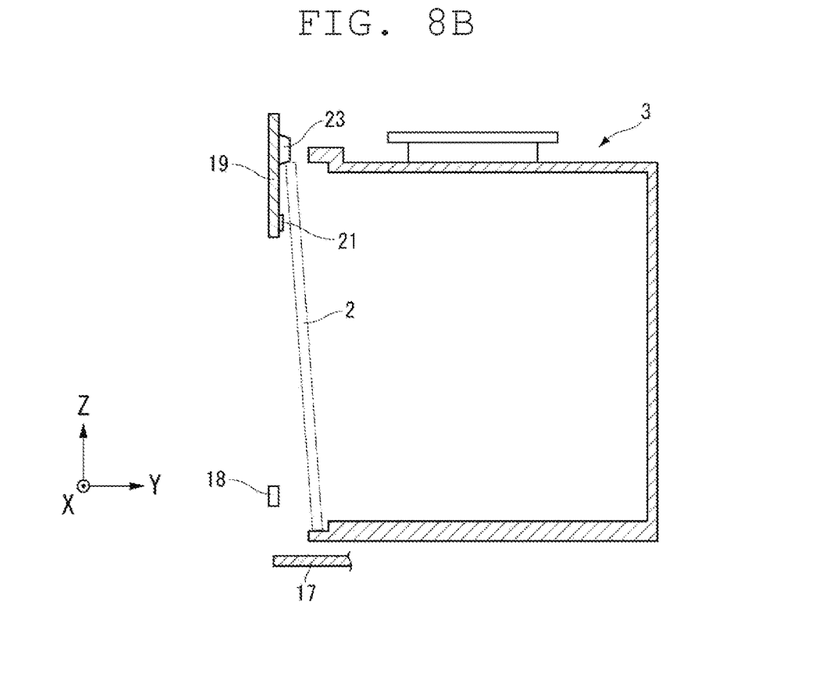
FIG. 8B is a view illustrating an example where the lid approach detector detects approach of the lid.

Next, a description is given of detection of the lid 2 by the lid detector 20 and the lid approach detector 21. FIG. 8A is a view illustrating an example where the lid detector 20 detects the presence or absence of the lid 2, and FIG. 8B is a view illustrating an example where the lid approach detector 21 detects approach of the lid 2. FIG. 8A illustrates a view of a state where a lower portion of the lid 2 has slipped toward the lid pressing piece 18, as seen from the X-direction. FIG. 8B is a view of a state where an upper portion of the lid 2 has fallen toward the lid fall preventive member 19, as seen from the X-direction.

As illustrated in FIG. 8A, when the lower end of the lid 2 is detached from the container 3, the lid 2 falls off the container 3 and is supported by the lid pressing piece 18 to be caught on the fall preventive piece 17. The lid 2 falls toward the container 3, with its lower portion as a fulcrum. In this state, light from the light emitter 20*a* (cf. FIG. 2) of the lid detector 20 is not incident on the lid 2 and thus not reflected on the lid 2. Accordingly, an amount of light incident on the optical sensor 20*b* decreases from the normal state and the level of the detection signal of the optical sensor 20*b* decreases, thus leading to detection that the lid 2 is detached. When the position in the Y-direction of the lid pressing piece 18 is a position at the end in the −Y direction of the fall preventive piece 17 or a position in the +Y direction from the end in the −Y direction of the fall preventive piece 17, the fall of the lid 2 is able to be reliably prevented.

Further, as illustrated in FIG. 8B, when the upper end of the lid 2 is detached from the container 3, the upper portion of the lid 2 falls toward the lid fall preventive member 19, with the lower portion of the lid 2 as a fulcrum. In this state, the lid approach detector 21 and the lid 2 is in an approached state and the level of the detection signal of the optical sensor 21b in the lid approach detector 21 changes from the normal state, thus leading to detection that the lid 2 is detached.

Figure 9:
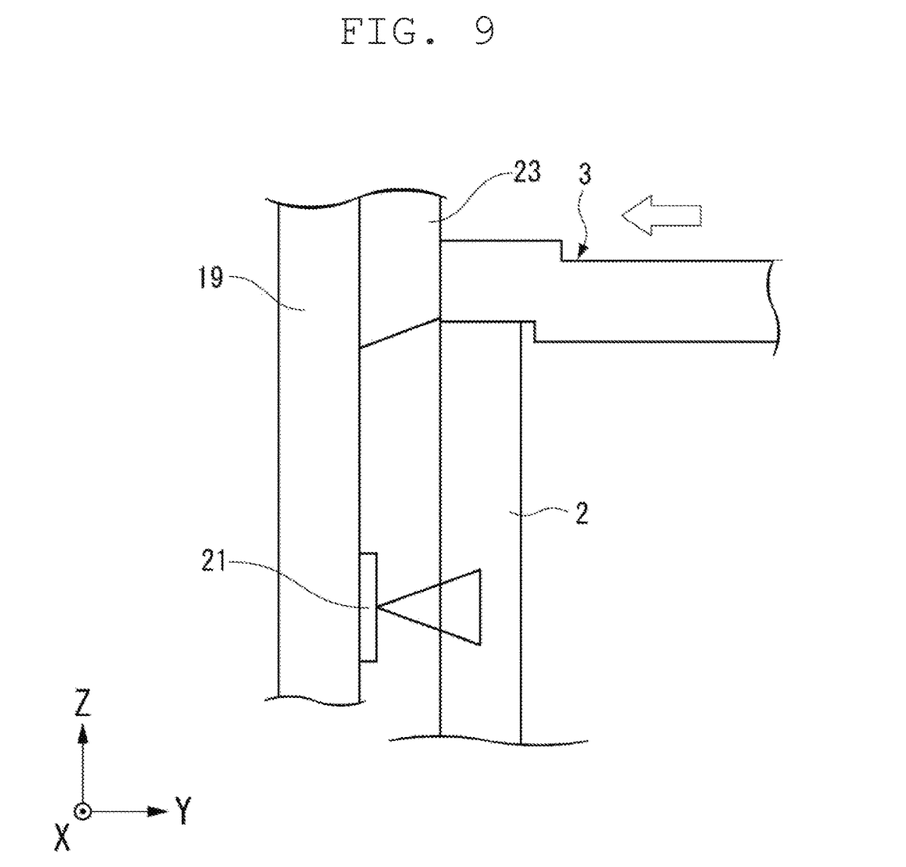
FIG. 9 is a view illustrating a state where a portion of the container is in contact with a stopper.

Next, a function of the stopper 23 will be described. FIG. 9 is an enlarged view illustrating the stopper 23 and a portion of the container 3. In the transport device 1, the container 3 may swing at a curve or the like during travelling. When the container 3 swings, the container 3 may approach the lid fall preventive member 19. When the container 3 approaches the lid fall preventive member 19 to a certain level, the stopper 23 comes into contact with a portion of the container 3 except the lid 2. When the stopper 23 comes into contact with a portion of the container 3 except the lid 2, the swing of the container 3 during travelling is significantly reduced or prevented to prevent the container 3 from approaching the lid fall preventive member 19. In this case, when the container 3 in the suspended state moves in the Y-direction, a space between the lid 2 and the lid approach detector 21 is able to be prevented from becoming equal to or smaller than the threshold while the lid 2 is not detached from the container 3, thus enabling the lid approach detector 21 to normally perform the detection. Hence, it is possible to prevent the lid approach detector 21 from detecting that the lid 2 is detached even though the lid 2 is not detached. Note that the stopper 23 may be provided with a sensor to detect contact with the container 3.

In this manner, according to the present preferred embodiment, it is possible to reliably determine the presence or absence of the lid 2 provided in the container 3 and determine the detachment of the lid 2, with a simple configuration. Hence, it is possible to easily and reliably determine the abnormal state where the lid 2 is not attached to the container 3, and to thus avoid erroneous fall of the stored object from the container 3 during transport of the container 3.

Second Preferred Embodiment

A second preferred embodiment of the present invention will be described. In the present preferred embodiment, a similar configuration to that of the above-described preferred embodiment is provided with the same reference symbol, and a description thereof is omitted or simplified.

Figure 10:
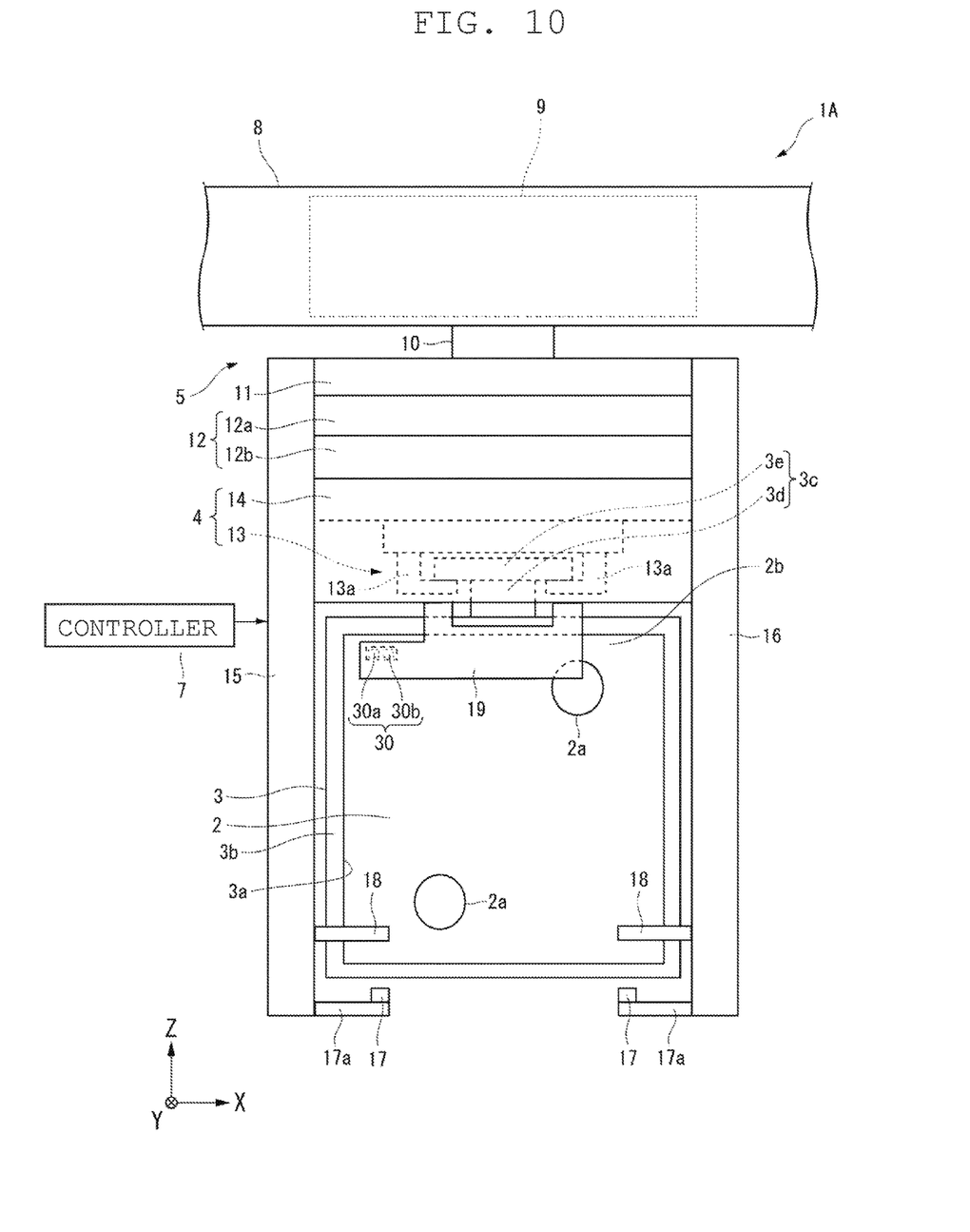
FIG. 10 is a view conceptually illustrating an example of a transport device according to a second preferred embodiment of the present invention.

FIG. 10 is a view conceptually illustrating an example of a transport device according to the second preferred embodiment. In the first preferred embodiment, the lid 2 of the container 3 preferably is detected by two detectors (the lid detector 20 and the lid approach detector 21), it may be detected by one detector. For example, a transport device 1A of the present preferred embodiment includes a detector 30 in place of the lid detector 20 and the lid approach detector 21 of the first preferred embodiment. Note that the elements and features other than the detector 30 of the transport device 1A are similar to those of the first preferred embodiment.

The detector 30 includes a light emitter 30a and an optical sensor 30b, for example. The light emitter 30a and the optical sensor 30b respectively have similar configurations to those of the light emitter 20a and the optical sensor 20b of the first preferred embodiment. The detector 30 is disposed in the position of the lid detector 20 of the first preferred embodiment, for example. The light emitter 30a emits light to the upper end of the lid 2. The optical sensor 30b detects the intensity of light, and outputs the detection result to the controller 22 (cf. FIG. 2). Based on the detection result (the intensity of light) of the optical sensor 30b, the controller 22 detects the presence or absence of the lid 2 and detects the detachment of the lid 2 from the container 3. In the state where the light emitter 30a is emitting light, the controller 22 compares a level of a detection signal of the optical sensor 30b with a threshold, to determine whether or not the lid 2 is detached from the container 3. For example, when the level of the detection signal from the optical sensor 30b is equal to or higher than the threshold while the light is being emitted from the light emitter 30a, the controller 22 determines that the lid 2 is normally attached to the container 3. When the light is not detected by the optical sensor 30b (e.g., when the level of the detection signal is lower than the threshold) while the light is being emitted from the light emitter 30a, the controller 22 determines that the lid 2 is detached from the container 3. Further, similarly to the controller 25 of the first preferred embodiment, when the intensity of light detected by the optical sensor 30b changes from the intensity of light in the state where the lid 2 is normally attached to the container 3, the controller 22 determines the state as the abnormal state where the lid 2 is detached from the container 3 and approaching.

In this manner, according to the present preferred embodiment, it is possible to reliably determine the presence or absence of the lid 2 provided in the container 3 and determine the detachment of the lid 2, with a simple configuration. It is thus possible to easily and reliably determine the abnormal state where the lid 2 is not attached to the container 3, and to thus avoid erroneous fall of the stored object from the container 3 during transport of the container 3.

Although the preferred embodiments have been described above, the technical scope of the present invention is not limited to the above descriptions, and various changes can be made within the scope not deviating from the gist of the present invention. For example, a plurality of lid detectors 20 or a plurality of lid approach detectors 21 may be provided. When a plurality of lid detectors 20 or a plurality of lid approach detectors 21 are used, at least one of those elements can be used as a spare, or those elements can be used for comparison with another lid detector 20 or another lid approach detector 21. Those elements may also be used for failure detection or the like of another lid detector 20 or lid approach detector 21.

In the above preferred embodiments, the optical detection technique is preferably used in each of the lid detector 20 and the lid approach detector 21. However, the lid 2 may be detected by another detection technique. For example, a contactless sensor such as a magnetic sensor, a capacitive sensor, or an ultrasonic sensor may be used.

In the above preferred embodiments, as the transport device 1, the example of the overhead travelling vehicle 5 has been described. However, in place of this, the transport device 1 may be applied to a ground travelling vehicle that travels along a track laid on a floor, a trackless travelling vehicle that travels on the floor, and the like.

In the above preferred embodiments, the container 3 preferably includes the detachable lid 2, but the present invention is not limited thereto. For example, a shutter that can be opened and closed may be used as the lid 2. When a container including this shutter is applied, the state without the lid is a state where the shutter is opened.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transport device for transporting a container that includes a lid on a side surface, the transport device comprising:
    a lid fall preventive member disposed so as to face an upper end of the lid of the container located in a transport position;
    a lid detector that is disposed in or on the lid fall preventive member and detects a presence or absence of the upper end of the lid; and
    a lifting driver that holds the container and raises or lowers the container; wherein
    the lid fall preventive member is provided in or on the lifting driver; and
    the lifting driver is moved in a lateral direction by a lateral protrusion mechanism.

2. The transport device according to claim 1, wherein the lid detector is disposed so as to face a portion laterally apart from a center of the upper end of the lid.

3. The transport device according to claim 1, further comprising a lid approach detector that detects an approach of the upper end of the lid.

4. The transport device according to claim 3, wherein the lid approach detector is disposed so as to face a flat portion on the lid.

5. The transport device according to claim 1, wherein the lid fall preventive member includes a stopper that comes into contact with a portion of the container except the lid to prevent the container from approaching.

\* \* \* \* \*